United States Patent [19]

Takahashi et al.

[11] Patent Number: 5,485,028

[45] Date of Patent: Jan. 16, 1996

[54] SEMICONDUCTOR DEVICE HAVING A SINGLE CRYSTAL SEMICONDUCTOR LAYER FORMED ON AN INSULATING FILM

[75] Inventors: Minoru Takahashi, Yokohama; Makoto Yoshimi, Tokyo; Naoyuki Shigyo, Yokohama, all of Japan

[73] Assignee: Kabushiki Kaisha Toshiba, Kawasaki, Japan

[21] Appl. No.: 38,946

[22] Filed: Mar. 29, 1993

Related U.S. Application Data

[63] Continuation-in-part of Ser. No. 668,674, Mar. 7, 1991, abandoned, which is a continuation of Ser. No. 416,457, Oct. 3, 1989, abandoned.

[30] Foreign Application Priority Data

| Oct. 3, 1988 | [JP] | Japan | 63-249382 |
| Feb. 14, 1989 | [JP] | Japan | 1-34406 |
| Apr. 21, 1989 | [JP] | Japan | 1-100310 |

[51] Int. Cl.$^6$ .......................... H01L 27/01; H01L 29/76; H01L 29/94
[52] U.S. Cl. .......................... 257/347; 257/344; 257/408
[58] Field of Search .......................... 257/57, 66, 347, 257/348, 350, 351, 352, 353, 349, 344, 408, 404, 409

[56] References Cited

U.S. PATENT DOCUMENTS 4,312,680  1/1982  Hsu .......................... 257/351
4,907,053  3/1990  Ohmi .......................... 257/347

FOREIGN PATENT DOCUMENTS 57-10266  1/1982  Japan .......................... 257/353

OTHER PUBLICATIONS

Malhi, S. D. S., et al., "Novel Soi CMOS Design Using Ultra Thin Near Intrinsic Substrate", *IEEE*, 1982, pp. 107–110.

*Primary Examiner*—Steven H. Loke
*Attorney, Agent, or Firm*—Foley & Lardner

[57] ABSTRACT

In a semiconductor device having a thin SOI film, the thickness of a semiconductor layer formed on an insulating film is so adjusted as to be less than a maximum distance allowable to complete depletion of the layer. While the thickness of a channel region is adjusted to be less than that of impurity-diffusion regions. Further, the insulating layer is so formed to have a thicker portion under the channel region, and thinner portions under the source region and the drain region as the impurity-diffusion regions. The semiconductor layer has steps at the boundaries between the channel region and the impurity-diffusion regions, and the top face of the channel region is arranged so as to be lower than the top faces of the impurity-diffusion regions. A region having a width less than the maximum depletion distance and an impurity concentration larger, than that of the channel region and less than that of the drain region is formed between the channel region and the drain region.

4 Claims, 14 Drawing Sheets

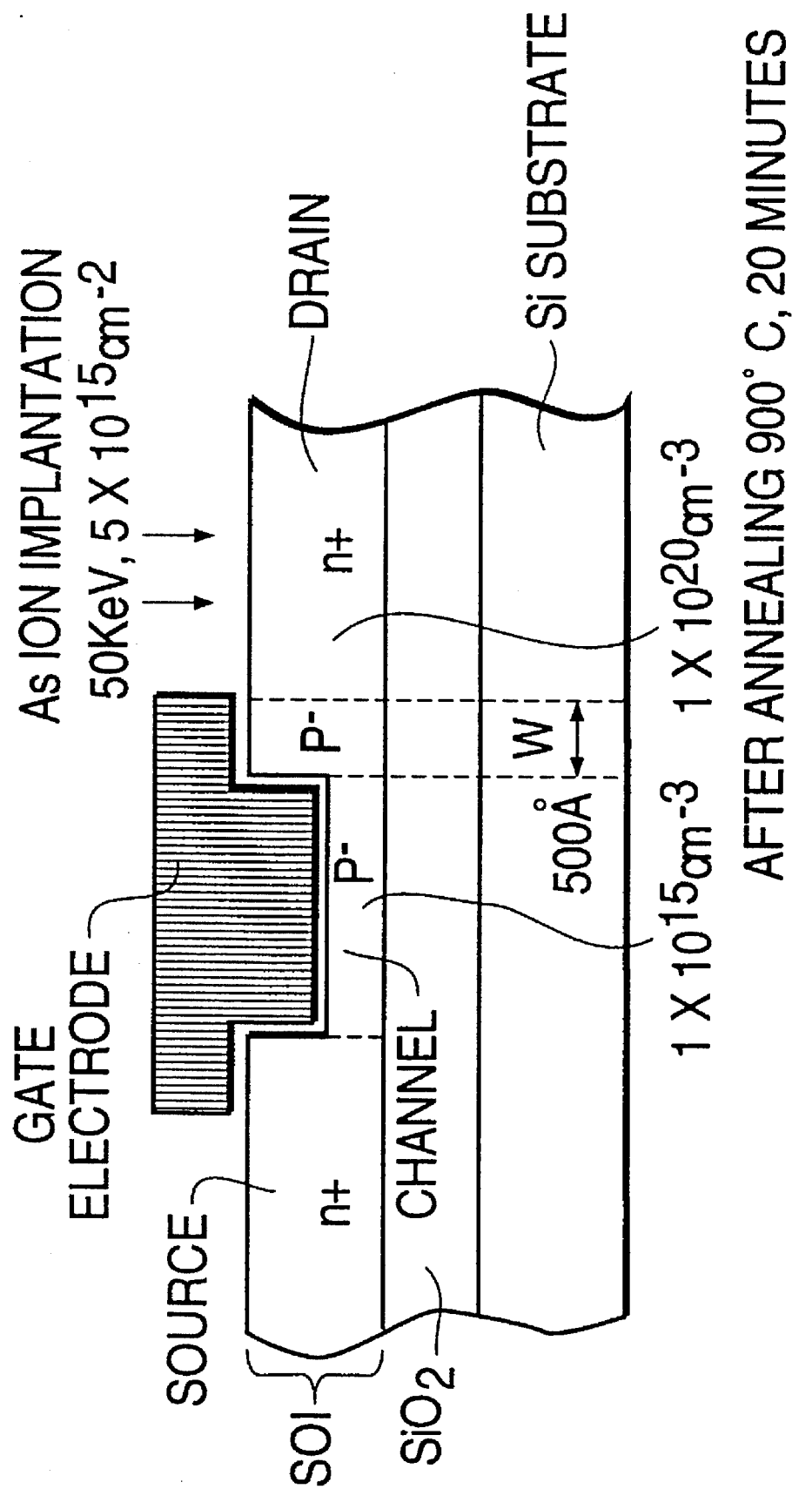

SEMICONDUCTOR DEVICE HAVING A SINGLE CRYSTAL SEMICONDUCTOR LAYER FORMED ON AN INSULATING FILM

BACKGROUND OF THE INVENTION

1. Field of the invention

This application is a continuation-in-part of U.S. application Ser. No. 07/668,674, filed on Mar. 7, 1991, now abandoned, which is a continuation of U.S. application Ser. No. 07/416,457, filed Oct. 3, 1989, now abandoned, and entitled to the filing date thereof for common subject matter.

This invention relates to a semiconductor device having a MOS transistor formed on an insulating film thereof, and particularly to a semiconductor device improved in transistor characteristics.

DESCRIPTION OF THE PRIOR ART

A MOS transistor formed on an SOI film has important merits, such as latchup free, low parasitic capacitance and the like. Particularly, as reported in the article "NOVEL SOI CMOS DESIGN USING ULTRA THIN NEAR INTRINSIC SUBSTRATE" in Tech. Abs. of IEDM, 1982, pp. 107–110, when the SOI film is so thin that the channel region is completely depleted in the operative mode, the punchthrough resistance can be improved. Further, reduction of the punchthrough effect and the like can be improved.

FIG. 11 is a cross sectional view showing the construction of a semiconductor device of this type. There are shown a silicon substrate 111, an insulating film 112, an SOI film 113, a gate oxide film 114, a gate electrode 115, source and drain regions 116, 117, and a channel region 118. Herein; the thickness of the SOI film 113 is adjusted to boa several hundred angstroms, sot hat the channel region is completely depleted in the operative mode of the device.

With respect to the above conventional device, the following fact could be clearly confirmed by simulations and detailed measurements of the transistor characteristics thereof. Namely, when the device's size becomes small, the so-called drain breakdown, in which the drain current rapidly increases with the drain voltage, becomes likely. Accordingly, it is clearly recognized that a range of voltage of the power source usable in this case should be strictly limited. As is shown in FIG. 12, the cause of the above phenomenon is that a low potential region is formed at the boundary between the source region 116 and channel SOI region 118. Holes (designated by a dotted line in the drawing) generated by an impact-on phenomenon in the vicinity of the drain region 117 then accumulate in the low potential region.

Namely, when the holes accumulate between the source and the channel SOI, an energy barrier between the source and the channel SOI is lowered, and a current flows in excess, so that drain breakdown is caused.

When the SOI film is thinned, the following problem is caused, in addition to the above problem. Namely, when the SOI film is thinned, the thickness of the source and drain diffusion regions becomes necessarily thinned. Accordingly, the resistance of the diffusion regions is increased, and reduction of the current amplification factor is caused. Moreover, when the thin diffusion region is opened to form contact holes by the dry etching method, the diffusion region may be removed, thus the electric wiring lose its conductivity.

As stated above, according to the conventional element construction based on a thinned SOI film, it is difficult to obtain a satisfactory MOS transistor.

SUMMARY OF THE INVENTION

An object of the present invention is to provide a semiconductor device which improves the drain breakdown voltage of MOS transistors formed on SOI films, and allows operation at a high speed, and a manufacturing method therefor.

In order to achieve the object, in the semiconductor device having a thin SOI film according to the present invention, the thickness of the SOI film is sufficiently thinned so that the channel region is completely depleted in the operative mode of an element, and the respective conductive types and thicknesses of the channel region, and the source and the drain diffusion region are arranged most suitably.

A semiconductor device in a preferred embodiment (FIG. 1) comprises a pair of high-concentration-impurity-diffusion regions (16, 17) (source and drain regions) formed so as to define a predetermined interval therebetween in a semiconductor layer (13) formed on an insulating film (12), and a gate electrode (15) formed on a channel region (18) interposed between the diffusion regions (16, 17) through a gate insulating film (14). Respective conductive types of the diffusion regions and the channel regions are arranged to be the same.

Further, when the thickness of the semiconductor layer is designated as T, the impurity concentration of the semiconductor layer as $N_{sub}$ ($cm^{-3}$), dielectric constant as $\epsilon$, where $\phi F$ is the difference between the Fermi energy level and the intrinsic energy level and basic electric charge of an electron as q (coulomb), the following equation is established:

$$T=2[\epsilon\phi F/(qN_{sub})]^{1/2}.$$

Another preferred embodiment is a MOS semiconductor comprising a pair of high-concentration-impurity-diffusion regions (source and drain regions) formed so as to define a predetermined internal therebetween in a semiconductor layer formed on an insulating film, and a gate electrode formed on a channel region interposed between the diffusion regions through a gate insulating film.

The thickness ($T_1$) of a semiconductor layer in a channel region (48) is arranged to be less than the maximum distance allowable to complete depletion (maximum depletion distance) in the channel region (48), and the thicknesses of the semiconductor layers in the diffusion regions (the source region 46 and the drain region 47) are arranged to be thicker than that of the channel region (48). When a semiconductor device is formed, as stated above, since the conductive type of the channel region between the source and the drain region is the same as that of the source and the drain regions, the energy barrier between the source region and the channel SOI region is lowered in the operative mode, and the drain breakdown voltage can be elevated. Thoughthe conductive type of the channel SOI region is the same as those of the source and the drain region, the drain current can be controlled low, at 0V of the gate voltage.

Moreover, since a sufficiently thin single-crystal semiconductor layer can be obtained in the channel region, there can be obtained a transistor with excellent switching characteristics. Additionally, since the thickness of the single-crystal semiconductor layer can be increased in the source and drain regions, the increase of resistance in the diffusion regions caused by thinning the SOI film, which is one of the above problems, is mitigated, and it becomes possible to prevent disappearance of the diffusion regions which may be conventionally caused, on forming the contact holes.

These and other objects, features and advantages of the present invention will be more apparent from the following description of the preferred embodiments, taken in conjunction with the accompanying drawings.

BRIEF DESCRIPTION OF THE DRAWINGS

FIG. 15 is a cross sectional view to show another configuration of semiconductor device as the seventh embodiment according to the present invention.

DETAILED DESCRIPTION OF THE PREFERRED EMBODIMENTS

Figure 1:
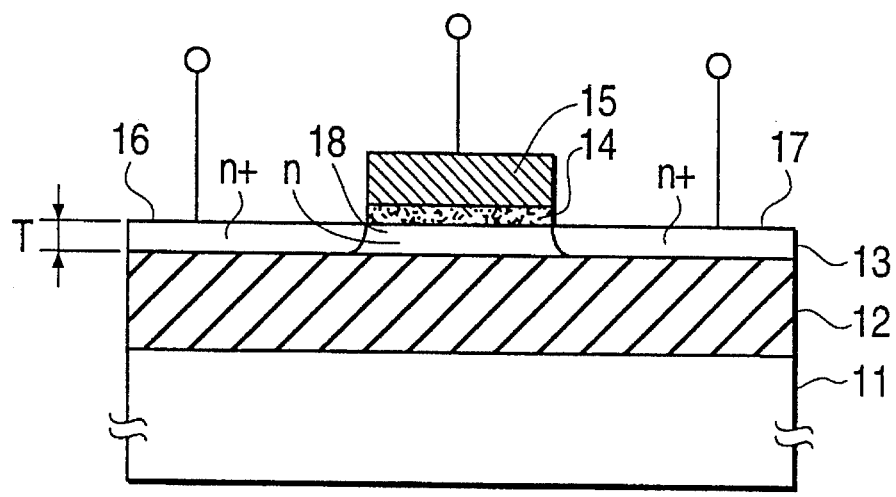
FIG. 1 is a cross sectional view showing a MOS transistor of a first embodiment of the present invention.

FIG. 1 is a cross sectional view to show a schematic construction of a semiconductor device which is a first embodiment of the present invention.

In the drawing, reference numeral 11 designates a silicon substrate, on which is formed an n-type single-crystal silicon layer (SOI film) 13 through an $SiO_2$ film (insulating film) 12. On the silicon layer 13, a gate electrode 15 is formed through a gate oxide film 14, further on the silicon layer 13, $n^+$-type impurity diffusion layers (source region and drain region) 16 and 17 are formed. Between the source region 16 and the drain region 17, a channel region 18 is interposed under the gate electrode 15. These source and drain regions 16, 17 and channel region 18 are of the same conductivity type. The thickness of the silicon layer 13 is, for example, 700 Å. This thickness (T) is thinner than that of the channel 18 to be completely depleted in the operative mode of the element. Namely, this thickness satisfies the condition based on the following equation:

$$T = 2[\epsilon \phi F/(q N_{sub})]^{1/2}$$

where $N_{sub}$ is the impurity concentration of the silicon layer 13 ($cm^{-3}$), $\epsilon$ is dielectric constant, $\phi F$ is the intrinsic difference between Fermi energy level and the energy level (eV), and q is basic electric charge of an electron (coulombs).

Next, a manufacturing method of the above MOS transistor will be explained.

FIGS. 2(a) to 2(d) are cross sectional views to show a manufacturing procedure of the MOS transistor.

Figure 2A:
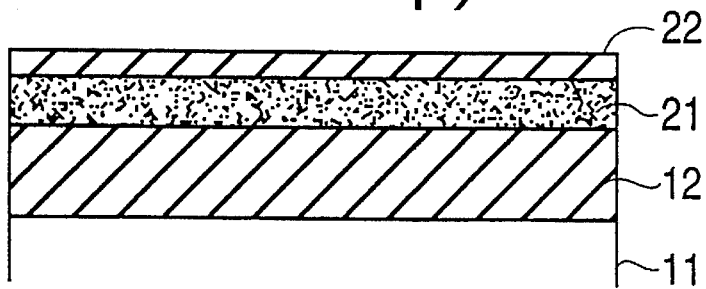
FIG. 2(a) to 2(d) are diagrams showing a manufacturing procedure of the MOS transistor in FIG. 1.

First, as shown in FIG. 2(a), on the single-crystal silicon substrate 11 having a surface with (100) orientation, the $SiO_2$ layer 12 (insulating film) with a thickness of 1 μm and a polycrystalline silicon film 21 with a thickness of 8000 Å were deposited by the LPCVD (Low Pressure Chemical Vapor Deposition) method. Then, on the silicon film 21, an $SiO_2$ film (protective layer) 22 with a thickness of 3000 Å was deposited.

Figure 2B:
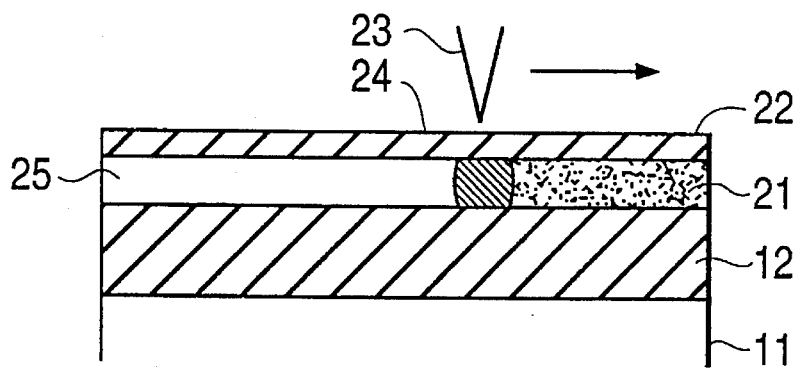

Subsequently, as shown in FIG. 2(b), the polycrystalline silicon film 21 was melted and recrystallized by scanning of an electron beam 23. Herein, reference numerals 24, 25 designate a melted portion and a single-crystal portion respectively. Thereafter, the silicon film 25 in the single-crystal state was etched overall by a dry etching method until the thickness thereof became 700 Å. Then, (arsenic) ions were doped into the silicon film 25 under the condition of the acceleration voltage of 40 KeV and the dose amount of $1 \times 10^{11}$ $cm^{-2}$.

Figure 2C:
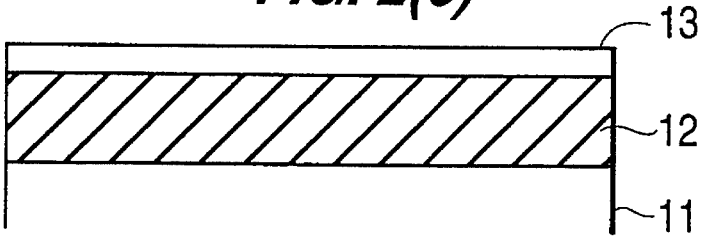

As the result, as shown in FIG. 2(c), the n-type single-crystal silicon layer 13 with a sufficiently thin thickness could be obtained.

Incidentally, the doping of impurity ions may be conducted to the polycrystalline silicon film 21 before the above single-crystallization by the electron beam (23).

Figure 2D:
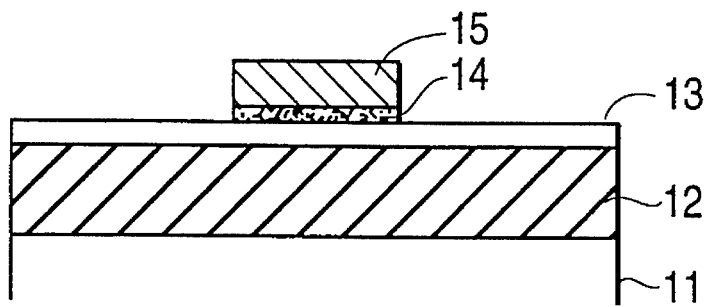

Next, as shown in FIG. 2(d), on the silicon layer 13, the gate electrode 15 was formed with a polycrystalline silicon doped with boron ions through the gate oxide film 14. Then, the $n^+$-type diffusion layers, source region and drain region 16, 17 were formed by As ion doping into the silicon layer 13 under an acceleration voltage 40 KeV and a dose amount of $2 \times 10^{15}$ $cm^{-2}$ using the gate electrode 15 as a mask. As stated above, the manufacturing of the MOS transistor was completed. In the so-obtained MOS transistor, the thickness of the SOI film was 500 Å, and the concentration of As in the channel region 18 was $2 \times 10^{16}$ $cm^{-3}$.

Figure 3:
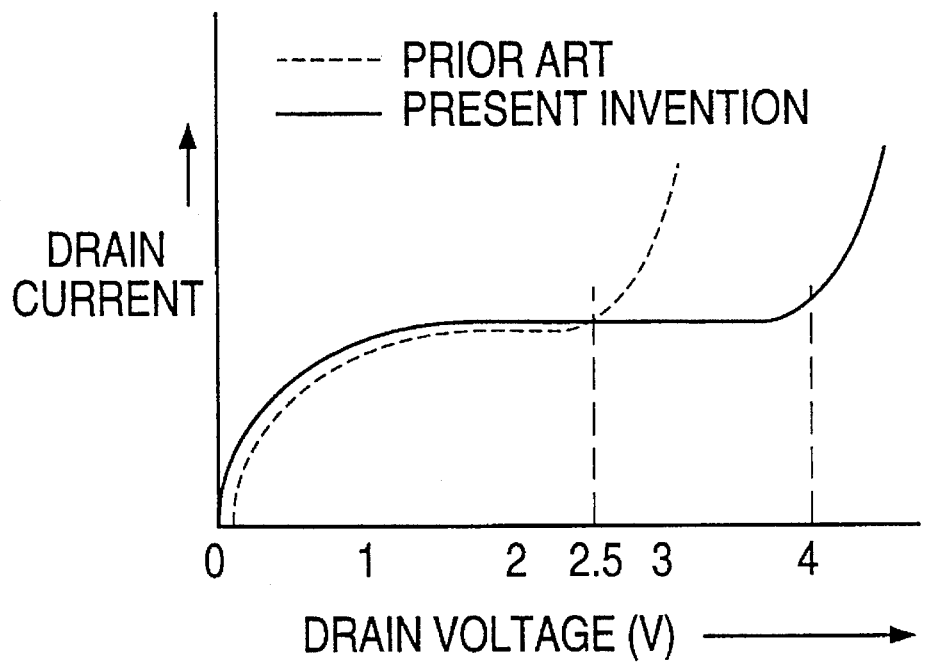
FIG. 3 is a diagram showing drain current-drain voltage characteristic curves of the MOS transistor in FIG. 1 and the MOS transistor described as a conventional example.

FIG. 3 shows a result of comparison of the drain current-drain voltage characteristic of the MOS transistor element and the above conventional element. As shown in the drawing, when the element of this embodiment is an n channel element in which the length of the channel region is 0.5 μm the drain break voltage is improved from 2.5 V to 4 V. According to the result of simulation by a computer, it could be clearly understood that the energy barrier between the source region and the channel SOI region is lowered in the operative mode of the element because the same n-type impurity is doped in the channel region, and the source and drain regions. Thus, the phenomenon as shown in FIG. 3 is caused. Moreover, in this embodiment, even though the channel region, and the source and drain regions are of the same conductivity type (n), the drain current at a gate voltage of OV is controlled to be sufficiently small. The reason is that the SOI film is completely depleted at the gate voltage of 0V because the thickness thereof is very thin (500 Å), so that the electric potential of the channel SOI region to electrons becomes too high to cut off the flow of electrons.

Figure 4:
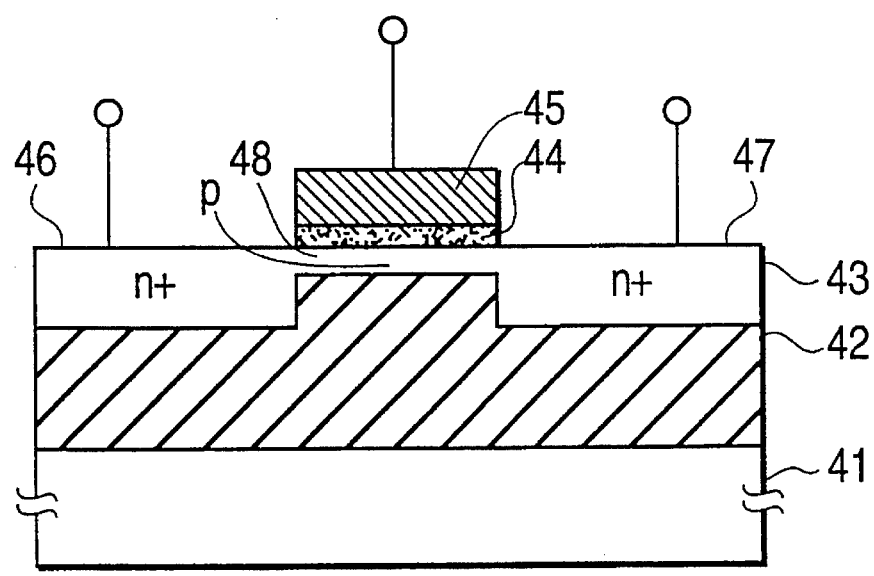
FIG. 4 is a cross sectional view to show a MOS transistor of a second embodiment of the present invention.

FIG. 4 is a cross sectional view to show a schematic construction of a semiconductor device relating to a second embodiment of the present invention.

In the drawing, reference numeral 41 designates a single-crystal silicon substrate on which is formed a p-type single-crystal silicon layer (SOI film) 43 through an $SiO_2$ film (insulating film) 42 having a partly thicker portion. On the silicon layer 43, a gate electrode 45 is formed through a gate oxide film 44 on the thicker portion of the $SiO_2$ film 42, further on the silicon layer 43, $n^+$-type impurity diffusion layers (source region and drain region) 46 and 47 are so formed as to interpose a channel region 48 under the gate electrode 45.

FIGS. 5(a) to 5(e) show a manufacturing procedure of the MOS transistor.

Figure 5A:
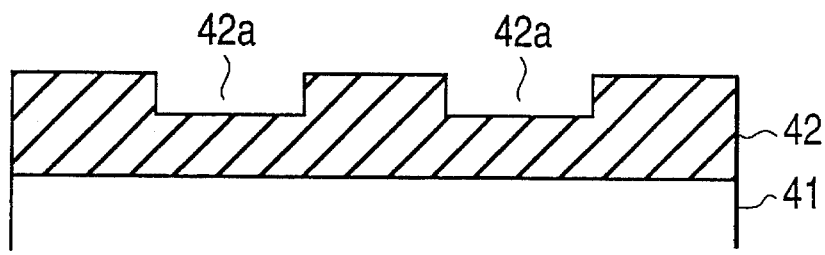
FIG. 5(a) to 5(e) are diagrams to show a manufacturing process for the MOS transistor shown in FIG. 4.

First, as shown in FIG. 5(a), the $SiO_2$ film 42 (insulating film) with a thickness of 1.5 μm was deposited by the CVD method on the single-crystal silicon substrate 41 having a surface with (100) orientation. Then, a resist pattern (not shown) was formed on the $SiO_2$ film 42, and concaved portions 42a with a depth of 5000 Å were formed at a predetermined interval in the $SiO_2$ film 42 by the reactive ion etching (RIE) method. Thereafter, the resist pattern which was used as a mask was removed.

Figure 5B:
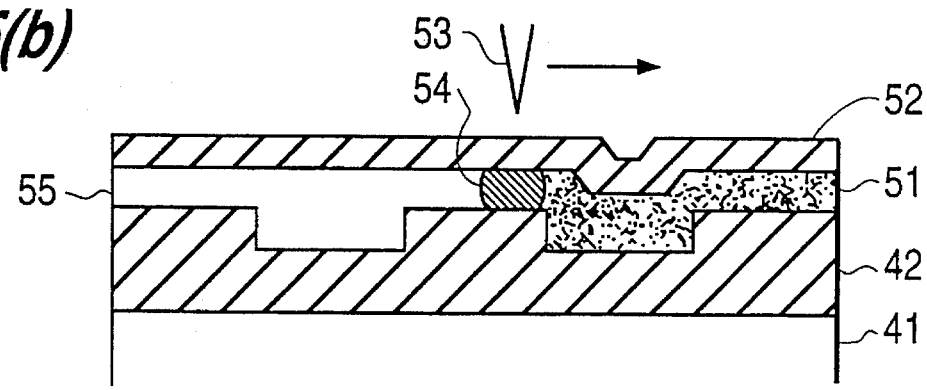

Subsequently, as shown in FIG. 5(b), a polycrystalline silicon film 51 with a thickness of 1.5 μm was deposited on the $SiO_2$ film overall, further an $SiO_2$ film 52 (protective film) with a thickness of 5000 Å was deposited thereon by the CVD method. Then, the polycrystalline silicon film 51 was melted and recrystallized by scanning of an electron beam 53. Herein, the acceleration voltage of the electron beam was 12 KeV, and the beam current was 6 mA. Incidentally, reference numerals 54 and 55 designate a melt portion and a single-crystal portion formed by the melting recrystallization by the annealing beam.

Figure 5C:
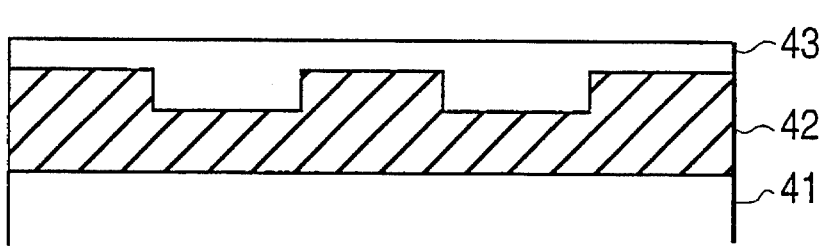

Then, the $SiO_2$ film 52 was removed with an ammonium fluoride solution to obtain a single-silicon film 55 having thick portions on the thinner portions of the $SiO_2$ layer 42 and thin portions on thicker portions thereof. Subsequently, the surface of the single-crystal silicon film 55 was oxidized by hydrogen combustion oxidization at 1000° C. to form an oxide film (not shown). Thereafter, the oxide film was removed with an ammonium fluoride solution to forms p-type single-crystal silicon layer 43 with a thin thickness as shown in FIG. 5(c). At the time, the thickness of a portion to be the channel region 48 in FIG. 4 in the single-crystal silicon layer 43 on the thicker portion in the $SiO_2$ layer 42 was arranged to be 1000 Å at the process shown in FIG. 5c. The thickness of portions in the single-crystal silicon layer 43 to be the source and the drain region on the thinner portions in the $SiO_2$ film was arranged to be 6000 Å.

Figure 5D:
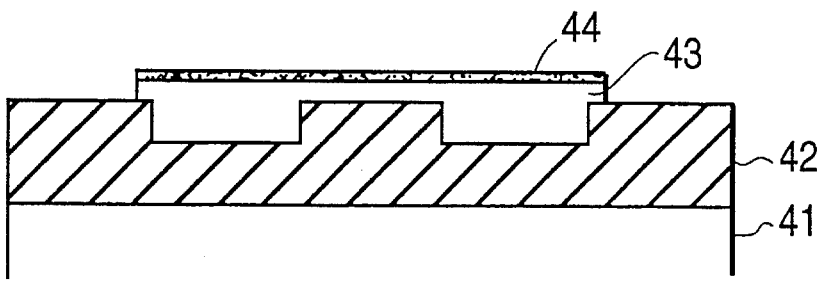

Next, as shown in FIG. 5(d), a resist pattern (not shown) was formed on the single-crystal silicon layer 43, and the single-crystal layer 43 out of element regions was removed by the RIE method using the resist pattern as a mask. Moreover heat oxidation was conducted under the condition of 900° C. to form $SiO_2$ film 44 (gate oxide film) with a thickness of 200 Å.

Figure 5E:
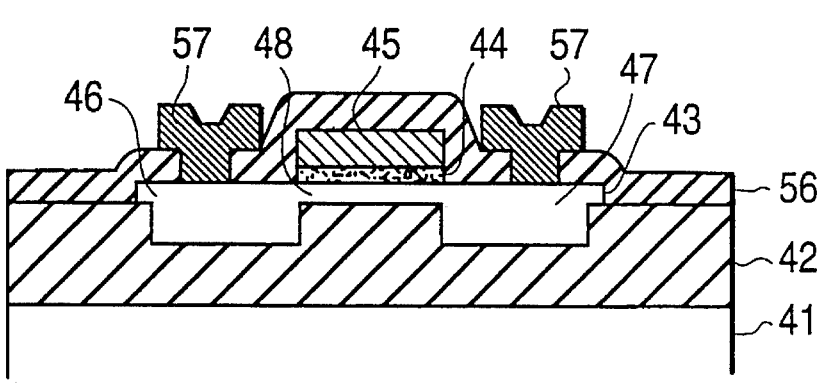

Then, as shown in FIG. 5(e), in accordance with a usual preparation procedure of a MOS transistor, the gate electrode 45 was formed. Thereafter, the $n^+$-type diffusion regions (source region and drain region) 46, 47 were formed, and an insulating film 56 was formed over all of the resultant surface, further contact holes were formed in the surface by the dry etching method. Lastly, aluminum wires 57 were provided thereon, and then the manufacturing of this MOS transistor was completed.

In the so-obtained MOS transistor, the thickness of the semiconductor layer in the channel region 48 is extremely small (900 Å). Thus, the transistor has an excellent switching characteristic. The thickness of the semiconductor layer 43 in the source and the drain region 46, 47 is large (5900 Å). Thus, the increase of resistance in the diffusion regions caused by a relatively thin SOI film can be prevented, and the disappearance of the diffusion regions which is the problem conventionally caused on forming the contact holes can be also prevented.

Thus, according to the present invention, the maximum potential ability of the thin film transistor can be presented.

Figure 6:
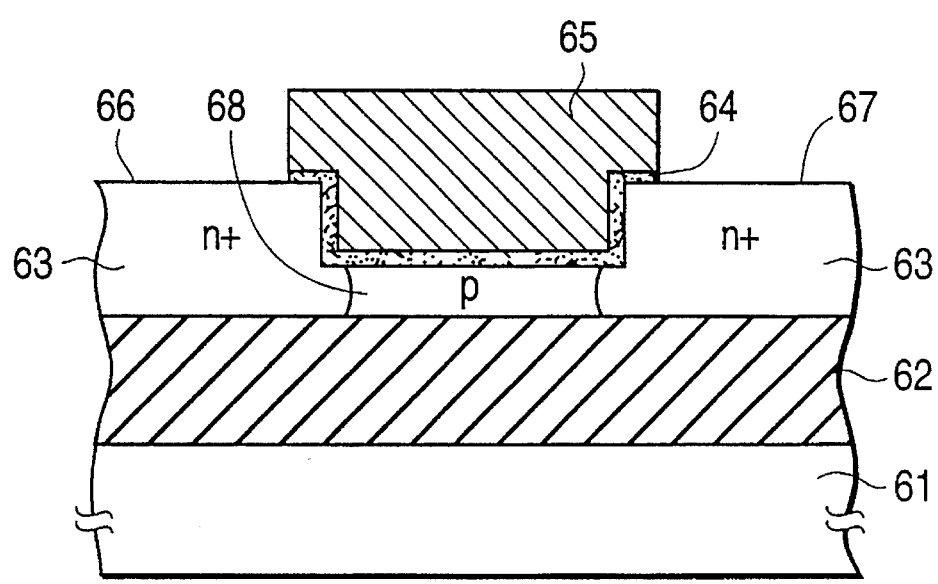
FIG. 6 is a cross sectional view of a MOS transistor of a third embodiment of the present invention.

FIG. 6 is a cross sectional view to show the schematic construction of a semiconductor device of a third embodiment in the present invention.

In the drawing, reference numeral 61 designates a single-crystal silicon substrate on which is formed a p-type single-crystal silicon layer (SOI film) 63 through an $SiO_2$ film (insulating film) 62. In the surface of the silicon layer 63, a thinner portion is provided in a portion corresponding to a channel region 68. On the thinner portion, a gate electrode 65 is formed through a gate oxide film 64. Further, on the silicon layer 63, impurity diffusion layers (source region and drain region) 66, 67 are so formed as to interpose the channel region 68 under the gate electrode 65.

FIGS. 7(a) to 7(d) are cross sectional views to show a manufacturing procedure of the above MOS transistor.

Figure 7A:
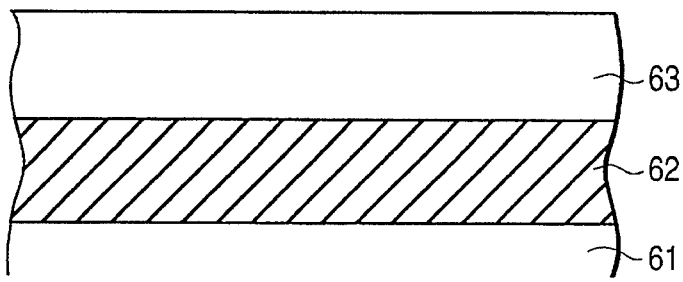
FIG. 7(a) to 7(d) are diagrams of a manufacturing process for the MOS transistor shown in FIG. 6.

First, as shown in FIG. 7(a), the p-type silicon substrate 61 was prepared, and the substrate 61 was doped with oxygen ions under the condition of, for example, an acceleration voltage of 400 KV and a concentration of $10^{19}$ cm$^{-3}$, to form a high concentration oxygen layer in the silicon substrate 61. Subsequently, the silicon substrate 61 was annealed at 1300° C. in a nitrogen atmosphere. Then, the high concentration oxygen layer was oxidized to form the silicon oxide buried layer 62 in the silicon substrate 61. Thereafter, boron ions were doped under the condition of, for example, the acceleration voltage of 40 KV and the concentration of $10^{15}$ cm$^{-3}$, to make the silicon layer 63 on the buried layer 62 into a p-type.

Figure 7B:
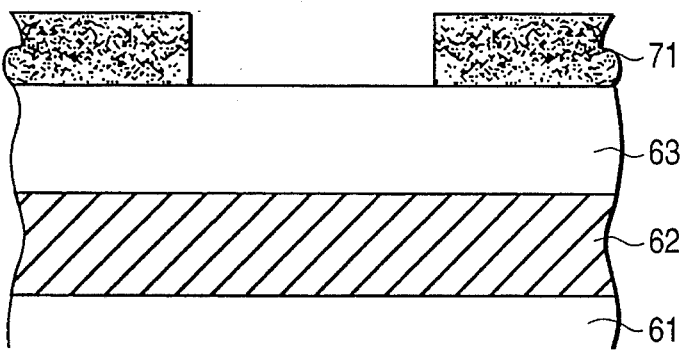

Then, as shown in FIG. 7(b), a resist film 71 with a thickness of 0.4 μm was deposited on the silicon layer 63. Next, a portion in the resist film 71 corresponding to the channel region 68 in the silicon layer 63 was opened by a well-known patterning method.

Figure 7C:
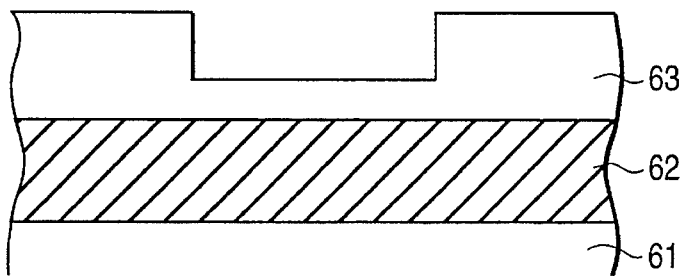

Subsequently, as shown in FIG. 7(c), the silicon layer 63 was partly etched by the RIE method using the resist film 71 as a mask so that the thickness of a portion in the silicon layer 63 to be the channel region 68 was arranged to be, for example, 0.05 μm. Thereafter, the resist film 71 was removed.

Figure 7D:
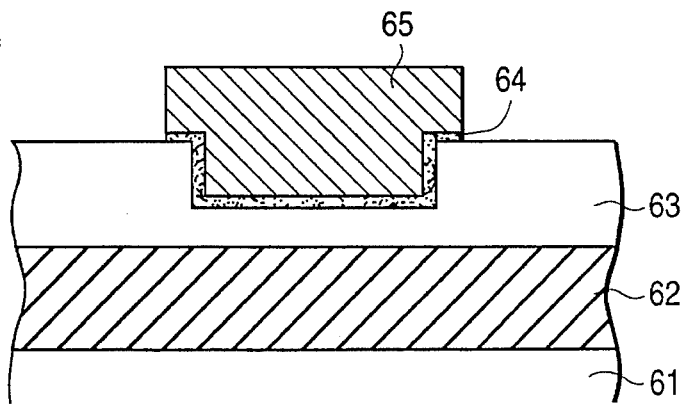

Next, as shown in FIG. 7(d), the gate oxide film 64 was formed so that the thickness thereof became, for example, 20 μm. Then a polycrystalline silicon film was deposited thereon so that the thickness of the deposited layer became 0.3 μm. Thereafter, the gate electrode 65 was formed by a well-known patterning method. Thereafter, for example, suitable ions are doped into the silicon layer 63 to form the source and the drain region 66, 67. Wiring is connected by a well-known method to prepare the MOS transistor.

In the MOS transistor of the embodiment obtained by the above method, the silicon layer 63 is the channel region 68 is very thin, thus the MOS transistor is excellent in the switching characteristic. The silicon layer 63 in the source and the drain region (66, 67) is relatively thick, Thus, the increase of resistance of the diffusion regions caused by a thin SIO film and disappearance of the diffusion layers conventionally caused on forming of the contact holes can be prevented.

Incidentally, since the channel region 68 is formed by the etching method after forming the silicon layer 63, the MOS transistor can be manufactured with ease.

Figure 9:
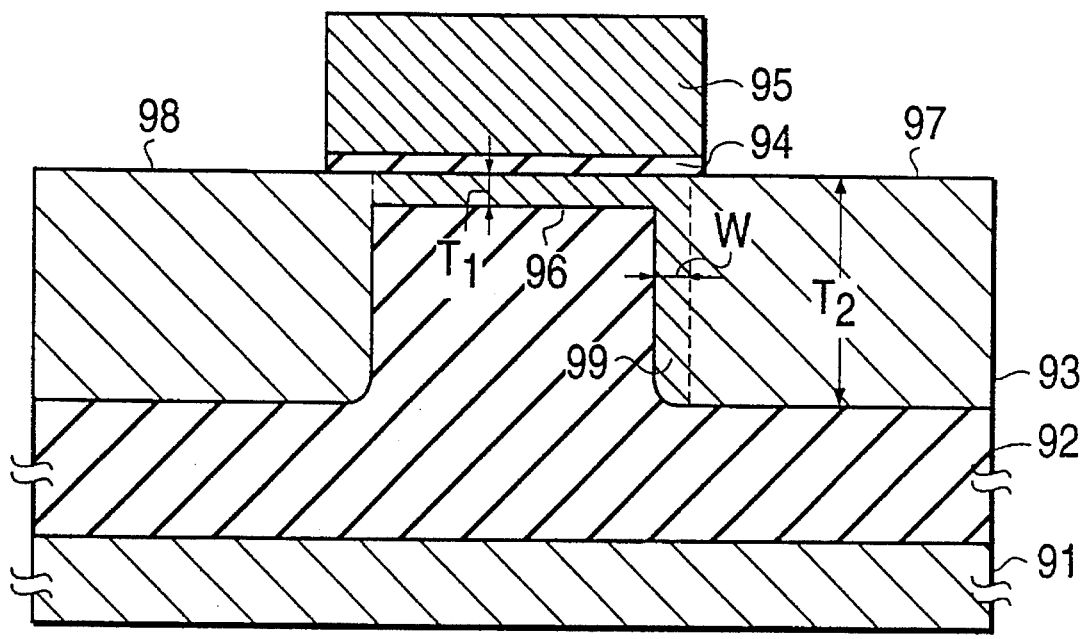
FIG. 9 is a cross sectional view of a MOS transistor of a fourth embodiment of the present invention.
Figure 10E:
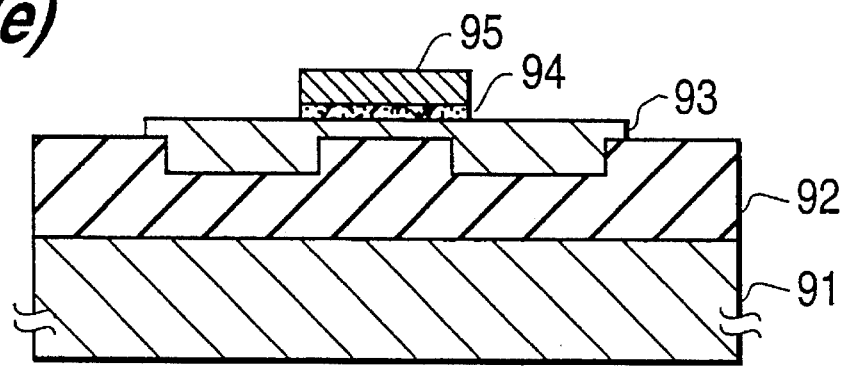
FIGS. 10(a) to 10(g) are diagrams to show a manufacturing procedure of the MOS transistor shown in FIG. 9.
Figure 10F:
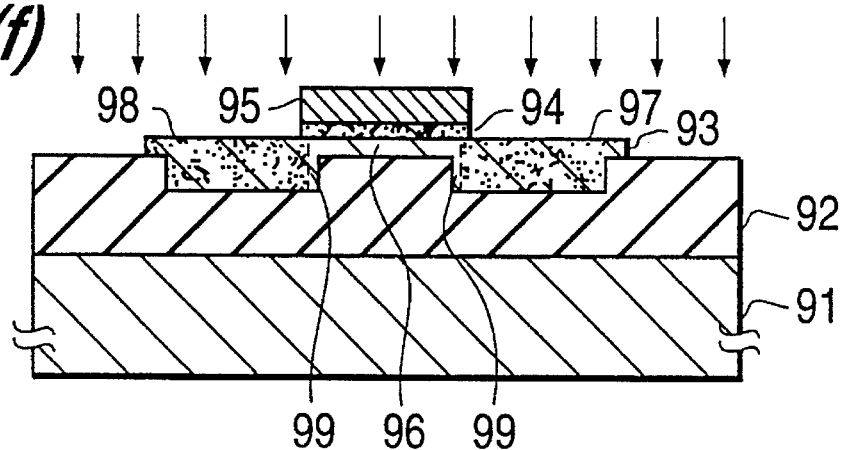
Figure 10G:
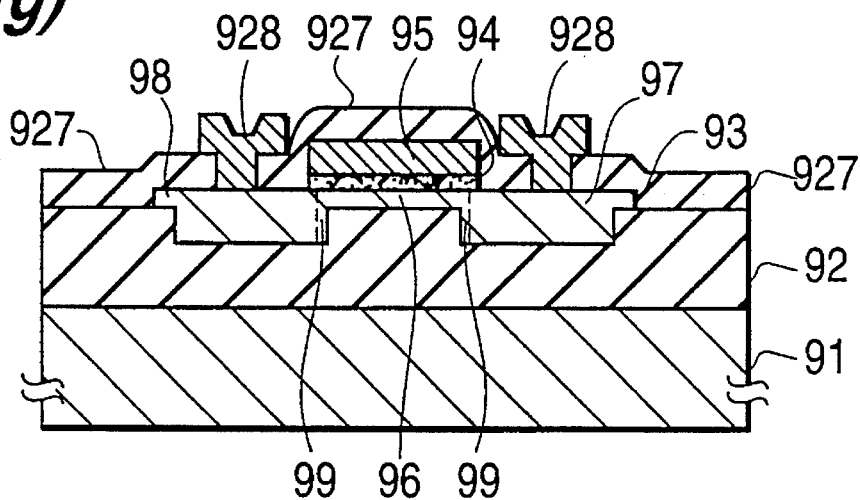
Figure 10A:
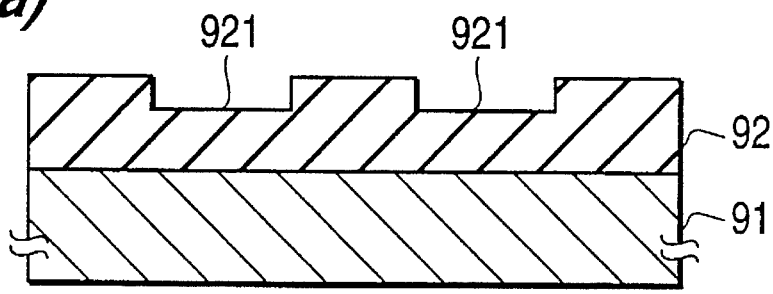
Figure 10B:
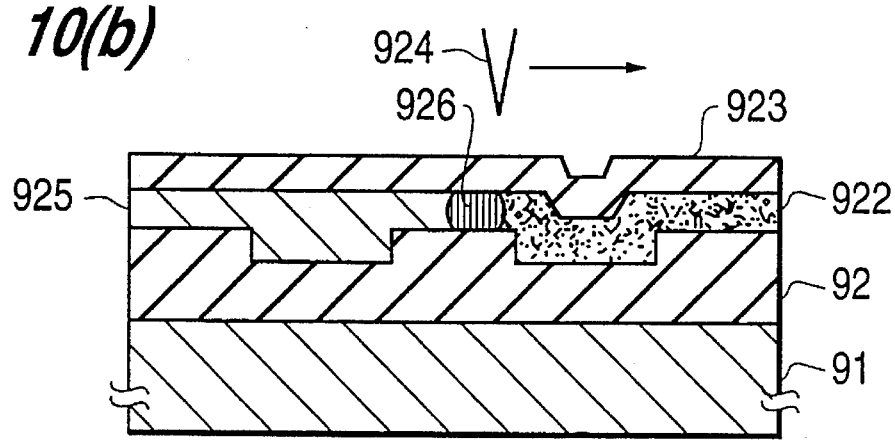
Figure 10C:
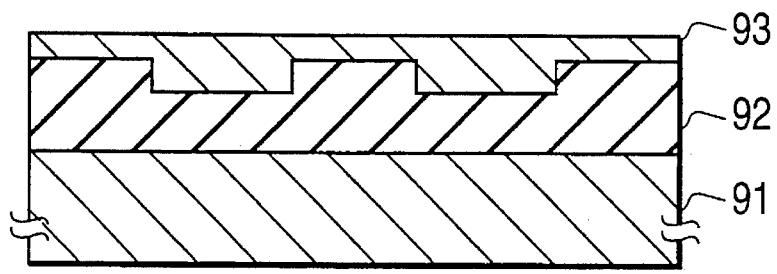
Figure 10D:
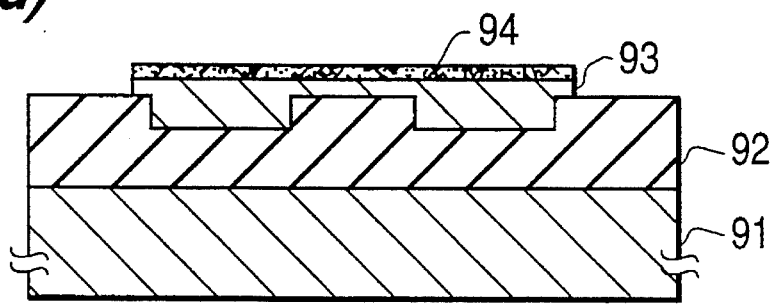
Figure 11:
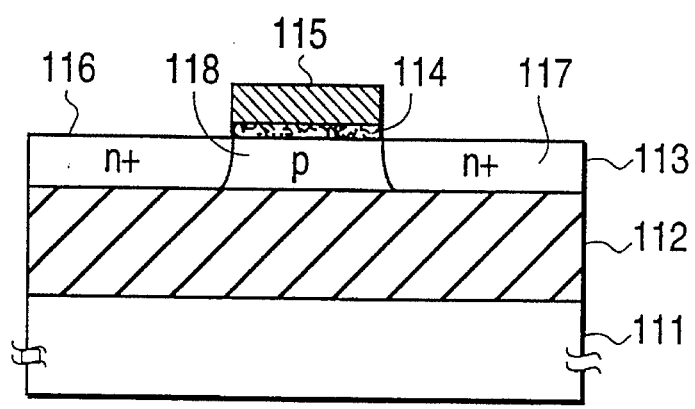
FIG. 11 is a cross sectional view of a conventional MOS transistor.
Figure 12:
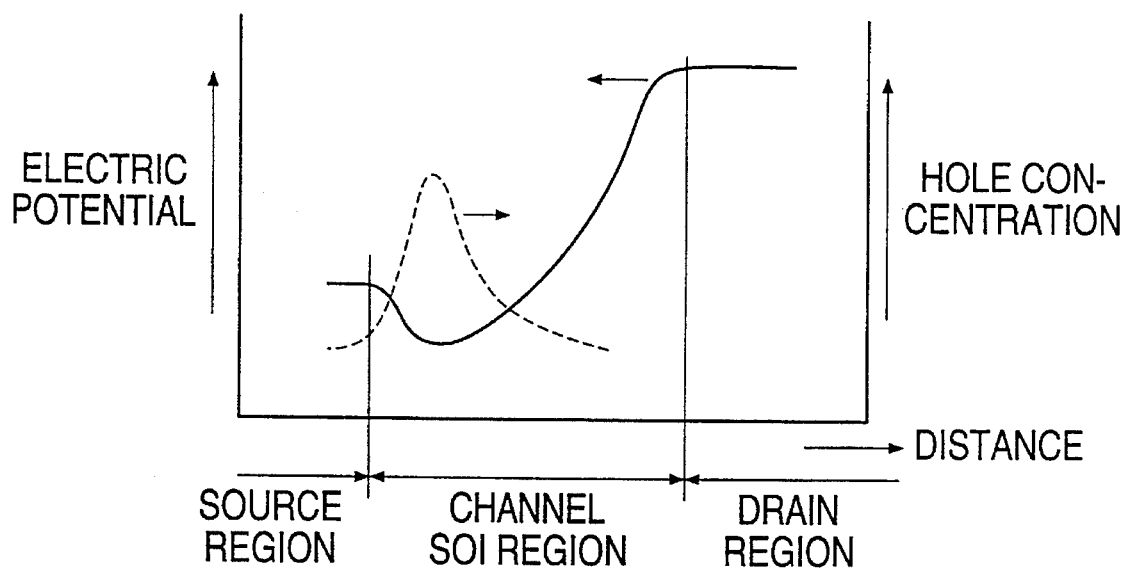
FIG. 12 is a diagram to show the relation between electric potential and concentration of holes in an SOI portion of the MOS transistor shown in FIG. 11.

FIG. 9 is a cross sectional view to show construction of a semiconductor device of a fourth embodiment in the present invention.

In the drawing, on a silicon substrate 91, an insulating film 92 comprising $SiO_2$ film having a thicker portion is formed, and an SOI film 93 comprising a p-type single-crystal silicon is formed on the insulating film 92.

On the thicker portion of the insulating film 92, a gate electrode 95 is formed through a gate oxide film 94. Further, in the SOI film 93, a drain region 97 and a source region 98 are so formed as to face each other and interpose a channel region 96 under the gate electrode 95. Between the channel region 96 and the drain region 97, a region 99 is provided in contact with the drain region 97.

In a MOS-type N channel transistor having the above construction, the thickness $T_1$ of the channel region 96 is set to satisfy the following equation similarly to the first embodiment:

$$T_1 \leq 2[\epsilon\phi F/(q N_{sub})]^{1/2},$$

wherein $\epsilon$, $\phi F$, q and $N_{sub}$ have the same meanings as those in the first embodiment, respectively.

In the equation, the right side designates a maximum thickness in which complete depletion of the channel region 96 can be allowed in the operative mode (maximum depletion distance). Accordingly, when a thickness of the channel region 96 is in the range provided in the equation, the channel region 96 is completely depleted in the operative mode of the element. Thus, there can be obtained an excellent switching characteristic.

While, when the thickness of the drain region 97 and the source region 98 is $T_2$, $T_2$ is so set as to satisfy the following equation:

$$T_2 > T_1,$$

Namely, the drain region 97 and the source region 98 are so formed as to be thicker than the channel region 96. Thereby, concentration of the electric field in the boundary region between the channel region 96 and the drain region 97 can be mitigated, as compared with the conventional construction in which the drain region is similarly thinned to the channel region. As the result, the drain break voltage at which the drain current is rapidly increased can be elevated.

The region 99 provided between the channel region 96 and the drain region 97 has substantially the same impurity concentration as the channel region 96, and the thickness of which is substantially the same as that of the drain region 97 and the width (W) of which is so set as to satisfy the following equation:

$$0 < W \leq 2[\epsilon\phi F/(q N_{sub})]^{1/2}$$

where $\epsilon$, $\phi F$, q and $N_{sub}$ have the same meanings as those in the first embodiment, respectively.

As stated above, the width (W) of the region 99 is set to be narrower than the maximum width in which complete depletion of the channel region 96 can be allowed in the operative mode. Namely, in the SOI film 93 of thickness $T_2$, the boundary between the n-type high-concentration-impurity region forming the drain region 97 and the region 99 is shifted by the width of W provided by the above equation to the side of the drain region 97 from the boundary at which the thickness of the SOI film 93 changes from $T_1$ to $T_2$.

Herein, when the region 99 is not present between the channel region 96 and the drain region 97, the thick and high-concentration-impurity drain region 97 is formed directly in contact with the thin and low-concentration impurity channel region 96. In such a case, the impurity of a high concentration in the drain region 97 tends to invade the channel region 96 by heat diffusion and the like. When the impurity of the drain region 97 invades the channel region 96, since the channel region 96 is thinly formed, the impurity concentration in a portion of the channel region 96 in the vicinity of the boundary between the channel region 96 and the drain region 97 becomes high, thereby increasing a change of the impurity distribution on the side of the drain region 97 in the channel region 96. Therefore, in the boundary of the channel region 96 and the drain region 97, the electric field easily concentrates. Thus, the drain breakdown voltage of 2.5 V (FIG. 3) is likely to be lowered.

However, in this embodiment, since the region 99 with a thickness substantially the same as that of the drain region 97 is provided between the channel region 96 and the drain 97, even though the impurity in the drain region 97 is diffused to the side of the channel region 96 by heat diffusion and the like, the impurity is stopped in the region 99 and does not invade the channel 96. Thus, the concentration of the electric field in the vicinity of the boundary between the channel region 96 and the drain region 97 can be mitigated, and the drain breakdown voltage of 2.5 V is still elevated, as compared with the case that the region 99 is not present.

Incidentally, since the width of the region 99 is so set as to be narrower than the maximum width in which the complete depletion of the channel region can be allowed, the holes generated in the drain region 97 are not accumulated completed in the region 99. Therefore, change of the characteristics of the element caused by the accumulation of the holes in the region 99 having a larger thickness than the above provision does not occur.

Next, a manufacturing method of a semiconductor device having the above construction will be described with reference to a manufacturing procedure shown by FIGS. 10(a) to 10(g).

In the manufacturing method shown in FIGS. 10(a) to 10(g), to simplify the manufacturing method, another region similar to the region 99 formed at the side of the drain region 97 is formed also at the side of the source region 98, and the region is designated by the same reference numeral 99. In such a manner, even though the region similar to the region 99 on the side of the drain region 97 is formed on the side of the source region 98, the effects of the embodiment in the present invention are not impaired, and the characteristics thereof is not lowered.

First, the insulating film 92 comprising $SiO_2$ and having a thickness of 1.5 μm was deposited by the CVD method on the p-type single-crystal silicon substrate 91 having a surface with (100) orientation. Subsequently, a resist pattern (not shown) was formed on the insulating film 92, and thinner portions 921 with a depth of about 3000 Å were formed using the resist pattern as a mask in the insulating film 92 by the reactive ion etching (RIE) method at predetermined intervals to each other. Thereafter, the resist pattern formed as a mask on the insulating film 92 was removed (FIG. 10(a)).

Next, polycrystalline silicon with a thickness of about 8000 Å was deposited over all of the surface to form a polycrystalline silicon film 922. Then, a protective film 923 comprising $SiO_2$ and having a thickness of about 5000 Å was formed by deposition by the CVD method on the polycrystalline silicon film 922. Thereafter, the processed substrate was subjected to the beam anneal treatment by scanning of an electron beam 924 under the condition of an acceleration energy of about 12 KeV and a beam current of about 6 mA, thereby conducting the melting recrystallization of the polycrystalline film 922 to form a single-crystal silicon film 925 (FIG. 10(*b*)). In FIG. 10(*b*), a region 926 designates a melt region of the polycrystalline silicon.

Subsequently, the protective film 923 was removed with an ammonium solution. Then, the surface of the single-crystal silicon film 925 was oxidized by the hydrogen combustion oxidization at about 1000° C. to form an oxide film (not shown). Thereafter, a p-type impurity was introduced into the single-crystal silicon 925 at a low concentration, and the oxide film formed on the single-crystal silicon film 925 was removed with an ammonium aqueous solution. Thus, the SOI film 93 comprising a p-type single-crystal silicon having thin portions on the thicker portions of the insulating film 92 was formed. The thickness of a portion in the SOI film 93 to be the channel region 96 on the thicker portions in the insulating film 92 was about 600 Å, and the thicknesses of portions in the SOI film 93 to be the drain region 97 and the source region 98 on the thinner portions in the insulating film 92 was about 3600 Å(FIG. 10(*c*)).

Then, a resist pattern (not shown) was formed on the SOI film 93, except that regions to be formed as an element were removed by the RIE method using the resist pattern as a mask. Thereafter, the processed substrate was subjected to the heat oxidization treatment at about 900° C. to form the gate oxide film 94 comprising $SiO_2$ with a thickness of about 200 Å on the SOI film. At the time, the surface of the SOI film 93 oxidized, and the thickness thereof was reduced by about 100 Å (FIG. 10(*d*)).

Subsequently, a polycrystalline silicon film was deposited over all of the surface. Then, a resist pattern (not shown) wider than the width of the thicker portion of the insulation film 92 by 2W at most, the polycrystalline film 93 and the gate insulating film 94, were removed by etching by the RIE method, using the resist pattern as a mask. Thus, the gate electrode 95 comprising a polycrystalline silicon wider than the width of the convex portion of the insulating film 92 was formed (FIG. 10(*e*)).

Then, phosphorus ions as an n-type impurity were introduced to the SOI film 93 by the ion doping under the condition of an acceleration voltage of 200 KeV and the dose amount of $1 \times 15^{15}$ cm$^{-2}$, thereby forming the drain region 97 and the source region 98 in the SOI film 93, so that both the regions 97, 98 interpose the gate electrode 15 therebetween. At the time, since the length (L) of the gate electrode 95 is longer than the width of the thicker portion of the insulating film 92 by 2W at most, as stated above, phosphorus ions are not introduced in the SOI film 93 in the vicinity of the thicker portion of the insulating film 92. Accordingly, the region 99 having substantially the same impurity concentration as the channel region 96 formed in the SOI film 93 under the gate electrode 95 is formed between the channel region 96 and the drain and the source regions 97, 98 so as to respectively have a width by self-adjustment of W at most (FIG. 10(*f*)).

Next, an insulating film 927 was formed all of over the surface, then contact holes were formed in the drain region 97 and the source region 98. The contact holes, allowed aluminum wires 928 to be wired. Thus, a MOS-type N channel transistor was formed (FIG. 10(*g*)).

In the so-manufactured transistor, since the drain region 97 is formed thicker than the channel region 96, the concentration of the electric field in the vicinity of the boundary between the channel region 96 and the drain region 97 can be mitigated, thereby elevating the drain breakdown voltage of 2.5 V. Moreover, since the region 99 of a low concentration is formed between the channel region 96 and the drain region 97, the diffusion of the impurity from the drain region 97 to the channel region 96 is prevented and the concentration of the electric field is further mitigated. Thus, the drain breakdown voltage can be much elevated, that is, the drain voltage at which the drain current is rapidly increased as shown in FIG. 3 can be much elevated as compared with the conventional example.

Figure 8:
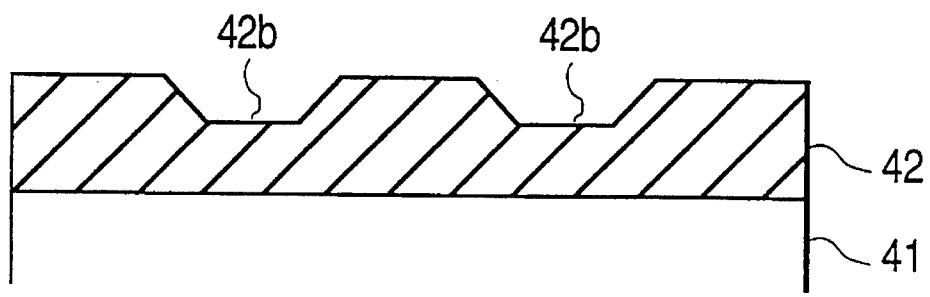
FIG. 8 is a cross sectional view of a modified example of concave portions in insulating films in the above embodiments.

Incidentally, it should be clearly understood that the present invention is not limited in the above embodiments. For example, the MOS transistor formed in the SOI film is not limited in the n channel type, but may be of the p channel type. Further, the thinner portions provided in the insulating film 63 under the single-crystal silicon layer shown in FIG. 7(*c*) and FIG. 10(*c*) may be tapered (42*b*) as shown in FIG. 8. Moreover, the conductive types of the channel region, the source and the drain region, in FIG. 4 are not limited into n and p channels, respectively, but may be the same conductive type. Additionally, the manufacturing procedures in the present invention are not limited in those shown in FIGS. 2, 5, 7 and 10, but may be suitably modified in accordance with the specification. Also, the construction of the present invention may be variously modified in range, while not departing from the gist of the present invention.

Further, in FIG. 9 the allowable impurity concentration in the region 99 is the same or larger than the impurity concentration of the channel region, and smaller than that of the drain region.

The fifth and seventh embodiments will now be explained. The semiconductor devices of the fifth and seventh embodiments have configurations that include a region of width W of P-channel conductivity type, like the first to fourth embodiments. However, this invention is not limited to the conductivity type of the first to seventh embodiments.

For example, a region of the width W of N⁻ conductivity type can be used for the present invention. In this case, the concentration of the W region is approximately equal to that of the p⁻ type semiconductor device described in the first to sixth embodiments.

FIGS. 13(*a*) to 13(*f*) are cross sectional views to show the fabrication process for the fifth embodiment according to the present invention. The fifth embodiment possesses basically the combination of FIGS. 6 and 9.

In FIG. 13(*a*), a single crystal Si (SOI layer) is formed on an $SiO_2$ film (insulating film). The $SiO_2$ film is a P-type SOI film having a concentration of $1 \times 10^{15}$ cm$^{-3}$.

In FIG. 13(*b*), a thinner portion 100 Å is formed on the SOI layer through a gate insulating layer. The thickness of the SOI film under the thinner portion is approximately 500 Å.

In FIG. 13(*c*), a gate electrode of polycrystalline Si is formed in the thinner portion.

In FIG. 13(*d*), the low-concentration ion implantation of (Boron:B) is carried out for forming P⁻ type areas for a source region and a drain region in the SOI layer. The acceleration voltage of 50 KeV and the dosage $1 \times 10^{12}$cm$^{-2}$ are used for the low-concentration ion implantation.

In FIG. 13(*e*), a resist is formed on the gate electrode and a part of the SOI portion to prepare a region having the width W of P⁻ type conductivity. Then, high-concentration ion implantation (Arsenic:As) is carried out for forming the N⁺ type portion for a source region and a drain region in the SOI layer. The acceleration voltage of 50 KeV and the dosage $5\times10^{15} cm^{-2}$ are used for the high-concentration ion implantation.

Figure 13A:
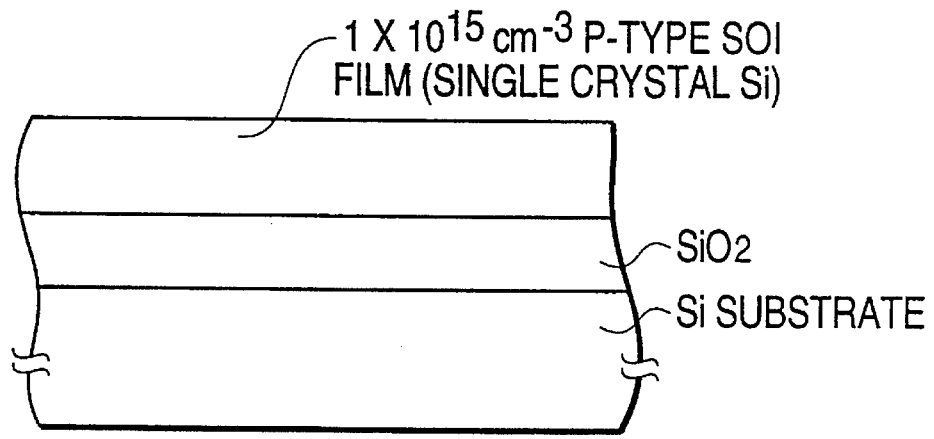
FIGS. 13(a) to 13(f) are cross sectional views to show the fabrication process of a configuration of the semiconductor device of the fifth embodiment according to the present invention.
Figure 13B:
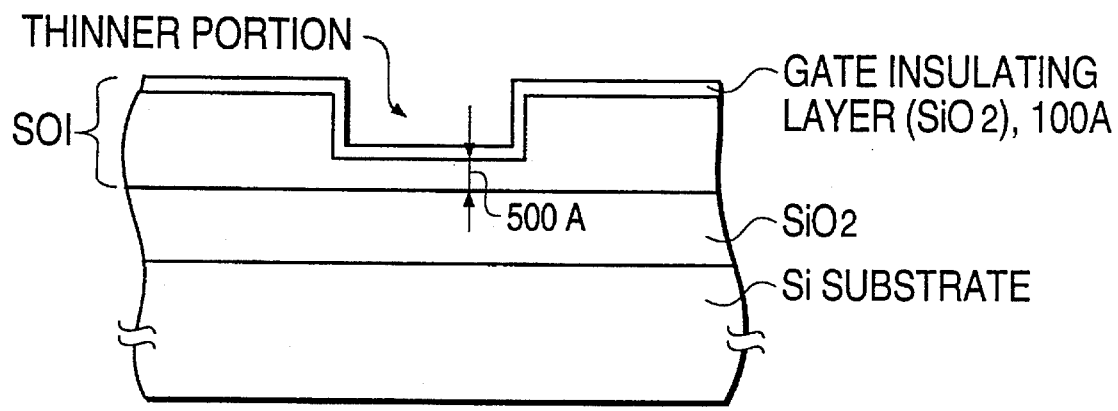
Figure 13C:
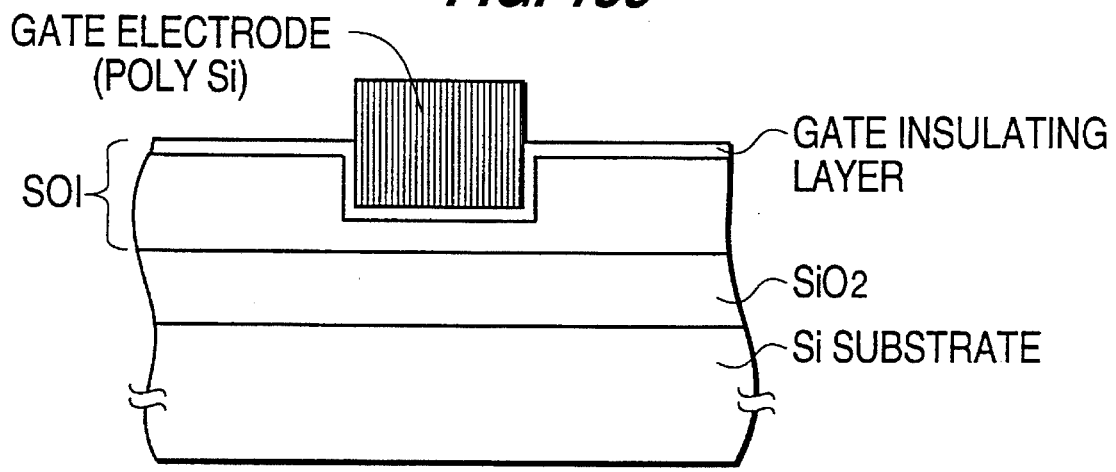
Figure 13D:
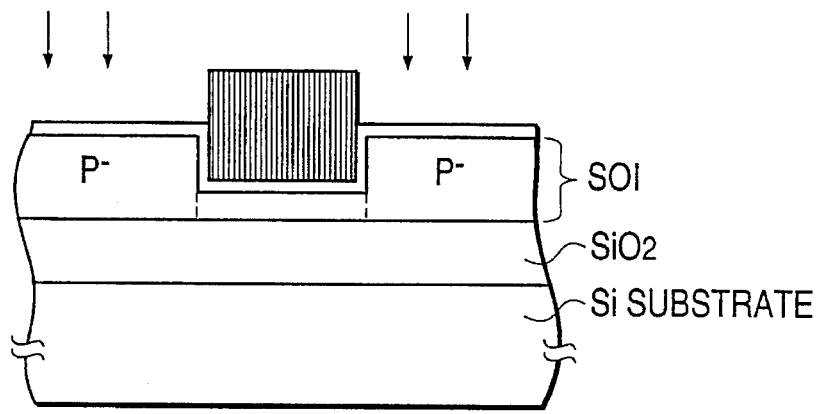
Figure 13E:
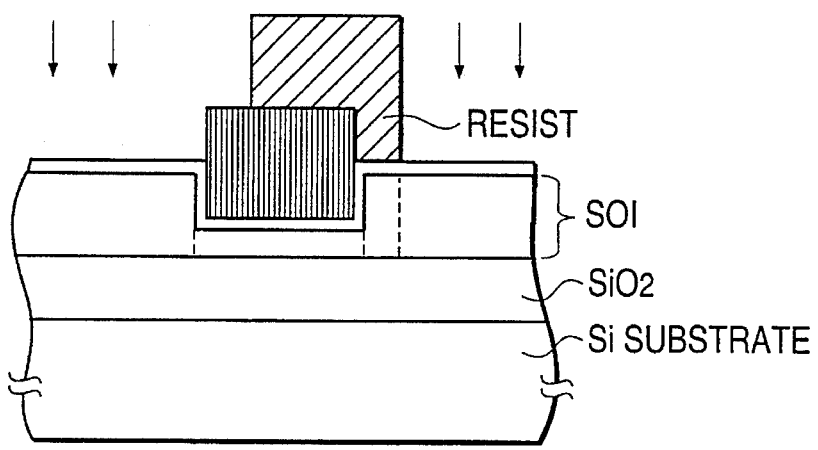
Figure 13F:
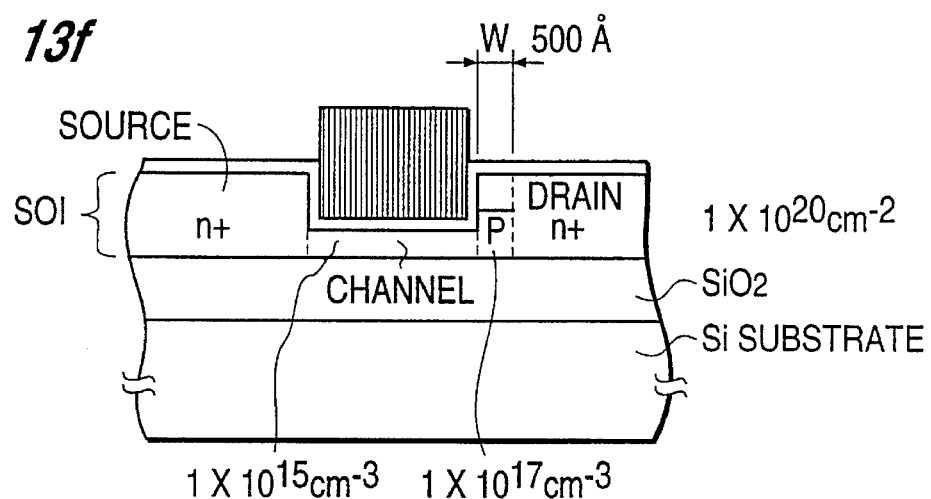

In FIG. 13(f), the region of width W of 500 Å is formed at the boundary portion between a channel region and the drain region. The concentration of the W portion of the P$^-$ type conductivity is $1\times10^{17} c=^{-3}$ and the concentration of the channel portion is $1\times10^{15} cm^{-3}$. The concentration of the drain portion is $1\times10^{20} cm^{-3}$.

The semiconductor device having the configuration described above is shown in FIG. 13(f). The source region and the drain region, respectively, consist of high-concentration-impurity-diffusion regions and are provided at a predetermined interval in the SOI layer. The gate electrode is formed on the channel region, and is interposed between the source region and the drain region through the gate insulating layer formed between the gate electrode and the channel region.

The thicknesses of the source region and the drain region are not less than that of the channel region. The bottom surface of the SOI layer, which faces the insulating film, is flat. The thickness of the channel region is less than that of the source region and the drain region, so that the thickness T of the channel region is adjusted as not to be more than the maximum distance allowed to complete depletion of the channel region. This thickness T is given by:

$$T \leq 2\ [\epsilon\phi F/(qN_{sub})]^{1/2}$$

where, $N_{sub}$ is the impurity concentration (per $cm^{-3}$) of the channel region in the SOI layer, $\epsilon$ is the dielectric constant of the SOI layer, $\phi F(eV)$ is the difference between the Fermi energy level and the intrinsic energy level of the channel region, and q is the basic electric charge of an electron (Coulombs).

The region having the width W, observed from the horizontal direction of the SOI layer, is less than the maximum depletion distance. The impurity concentration is, substantially the same or larger than that of the channel region but less than that of the drain region. It is formed in the boundary portion between the channel region and the drain region.

The width W is given by:

$$0 < W \leq 2[\epsilon\phi F/(qN_{sub})]^{1/2}$$

where, $N_{sub}$ is the impurity Concentration (per $cm^{-3}$) of the channel region in the SOI layer, $\epsilon$ is the dielectric constant of the SOI layer, $\phi F(eV)$ is the difference between the Fermi energy level and the intrinsic energy level of the channel region, and q is the basic electric charge of an electron (Coulombs).

As described above in detail, in the fifth embodiment, the region of the width W is formed to be thicker than the channel region. As a result, the strength of the electric field in the vicinity of the boundary portion between the channel region and the drain region can be mitigated, thereby elevating the drain breakdown voltage.

Moreover, since the region of the width W of the low-concentration is formed between the channel region and the drain region, diffusion of the impurity from the drain region to the channel region is prevented and the strength of the electric field is further mitigated. Thus, the drain breakdown voltage can be greatly increased, that is, the drain voltage at which the drain current is rapidly increased, as shown in FIG. 3, can be much elevated as compared with the conventional example described in the description of the prior art.

Moreover, the conductivity type of the region of width W can be different from that of the channel region. The conductivity type of the region of width W is the same as that of the source region and the drain region. In addition, the concentration of the conductivity type of the region of the width W is less than that of said source region and said drain region.

The region of width W is formed in the boundary portion forward of the channel region from the drain diffusion region. The impurity concentration of the region of the width W is decreased continuously from the drain region to the channel region.

The configuration, especially the region of the width W, of the fifth embodiment is easier formed in a fabrication process than that of the fourth embodiment shown in FIG. 9, because the gate electrode is formed by self-alignment.

Next, a sixth embodiment according to the present invention will be described.

FIGS. 14(a) to 14(e) are cross sectional views to show the fabrication process of a configuration of the sixth embodiment according to the present invention.

The sixth embodiment has the combined configuration of FIG. 6 and FIG. 9, basically, like the fifth embodiment.

Figure 14A:
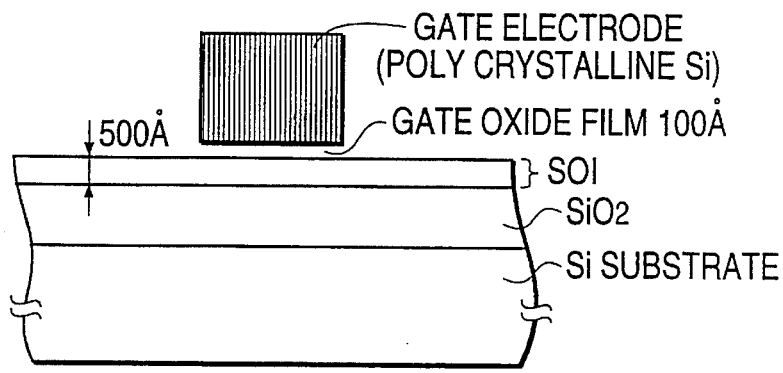
FIGS. 14(a) to 14(e) are cross sectional views to show the fabrication process of a configuration of semiconductor device as sixth embodiment according to the present invention.

In FIG. 14(a), a gate electrode made of polycrystalline Si is formed on a gate insulating layer of 100 Å.

Figure 14B:
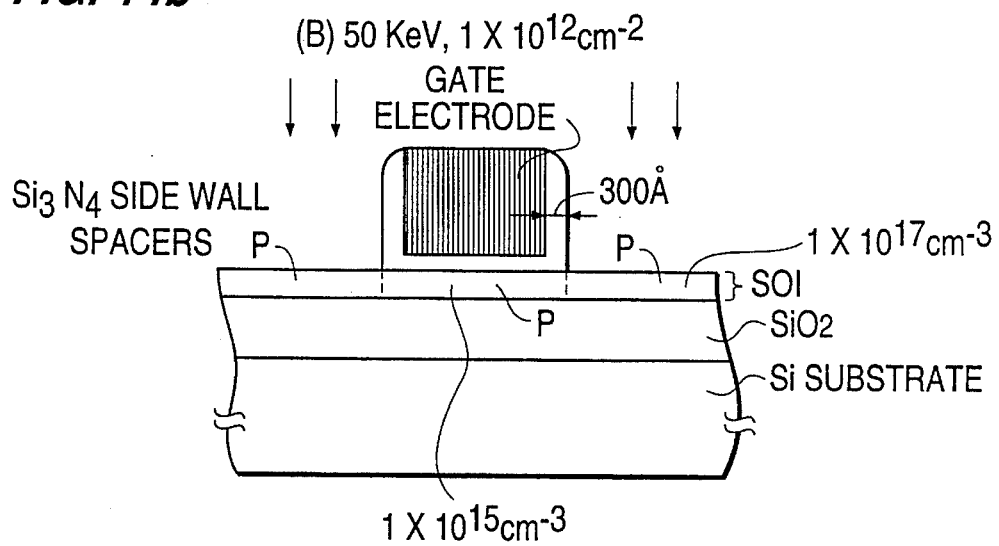

In FIG. 14(b), side wall spacers of $Si_3N_4$ are provided at both sides of the gate electrode. Then, low-concentration ion implantation (Boron:B) is carried out for forming the P$^-$type conductivity portion in the SOI layer. The acceleration voltage of 50 KeV and the dosage $1\times10^{12} cm^{-2}$ are used for the low-concentration ion implantation to form the P$^-$ type ($1\times10^{17} cm^{-3}$) regions.

Figure 14C:
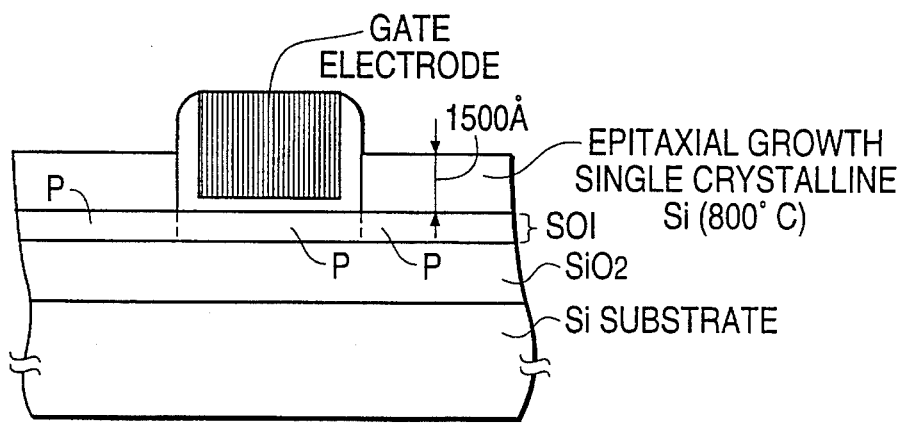

In FIG. 14(c), a single crystalline Si layer of 1500 Å is formed on the SOI layer by epitaxial growth under a temperature of 800° C.

Figure 14D:
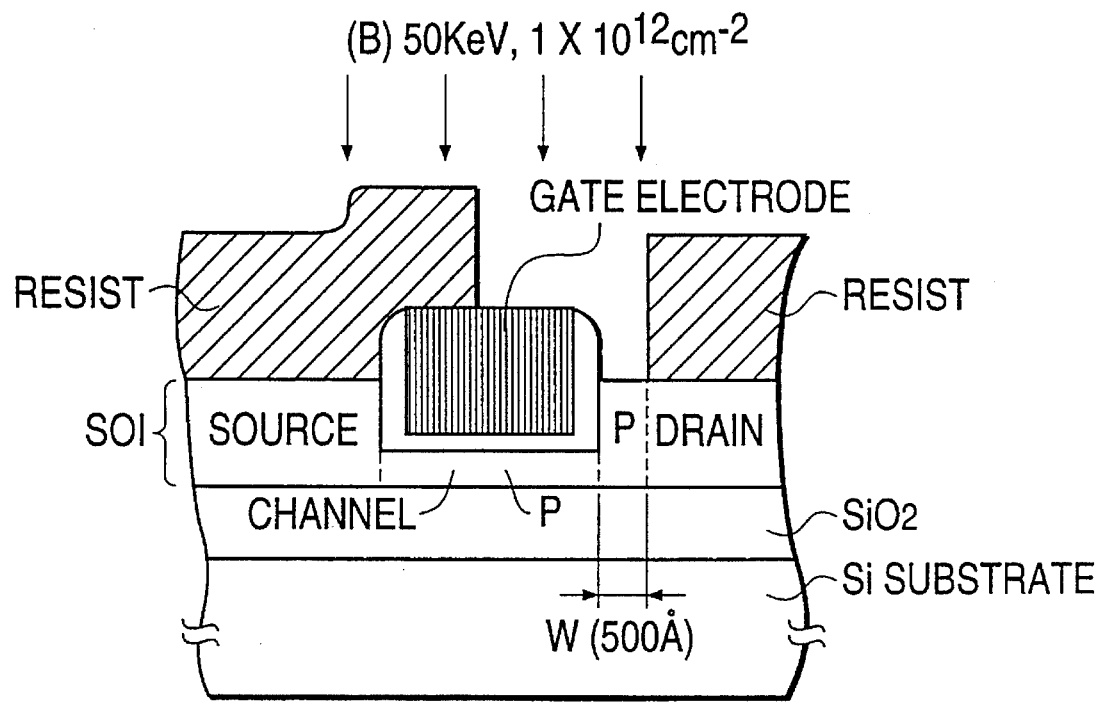

In FIG. 14(d), a resist is formed on the gate electrode and the SOI layer. No resist is formed on a region of the width W of 500 Å between the P type channel region and the drain region. Then low-concentration ion implantation (Boron:B) is carried out for forming the P$^-$ type conductivity portion in the region of the width W.

The acceleration voltage of 50 KeV and the dosage $1\times10^{12} cm^{-2}$ are used for the low-concentration ion implantation.

Figure 14E:
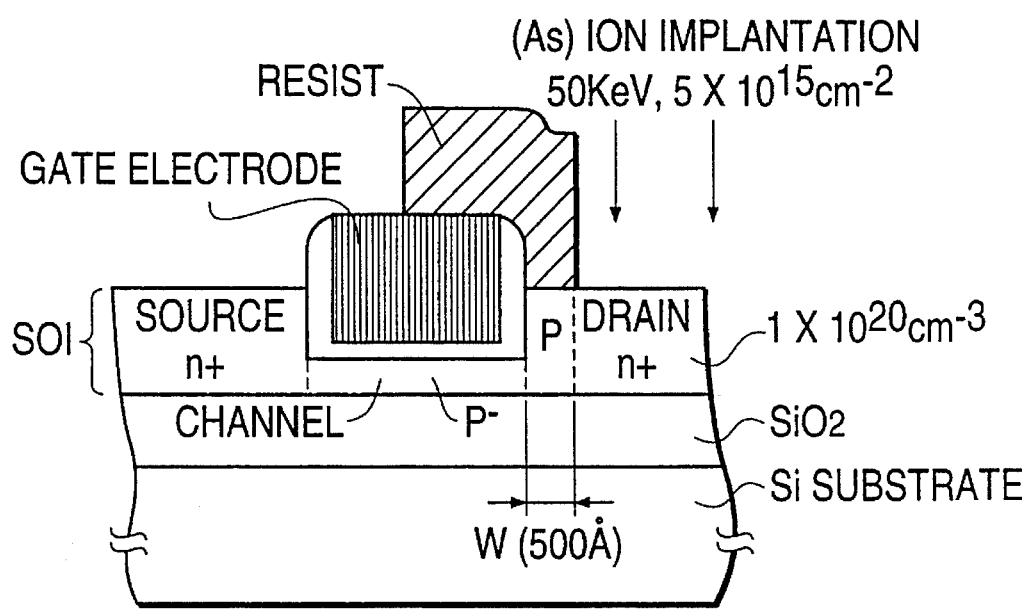

In FIG. 14(e), a resist is formed on the gate electrode and the region of width W after removing the resists formed in the step shown in FIG. 14(d).

Then, high-concentration ion implantation (Arsenic:As$^+$) is carried out for forming the N$^+$ conductivity type portion of the source and the drain.

The acceleration voltage of 50 KeV and the dosage $5\times10^{15} cm^{-2}$ are used for the high-concentration ion implantation.

In the semiconductor device having the configuration described above, as shown in FIG. 14(e), the source region and the drain region respectively consisting of high-concentration-impurity-diffusion regions are provided at a predetermined interval in the SOI layer. The gate electrode is formed on the channel region and it is interposed between the source region and the drain region through the gate insulating layer formed between the gate electrode and the channel region.

The thicknesses of the source region and the drain region are not less than that of the channel region. The bottom surface of the SOI layer facing the insulating film is flat. The thickness of the channel region is less than that of the source region and drain region, so that the thickness T of the channel region is adjusted as to be not more than the maximum distance allowed to complete depletion of the channel region, the thickness T being set like the fifth embodiment described above.

The region of width W, observed from the horizontal direction of the SOI layer, less than the maximum depletion distance, and the impurity concentration substantially the same or higher than that of the channel region but lower than that of the drain region is formed in the boundary portion between the channel region and the drain region.

The region of the width W is also provided like the fifth embodiment.

As described above in detail, in the fifth embodiment and the sixth embodiment, the region of width W is formed to be thicker than the channel region. The strength of the electric field in the vicinity of the boundary portion between the channel region and the drain region can be mitigated, thereby elevating the drain breakdown voltage.

Moreover, since the region of the width W of low-concentration is formed between the channel region and the drain region, diffusion of the impurity from the drain region to the channel region is prevented and the strength of the electric field is further mitigated. Thus, the drain breakdown voltage can be much elevated, that is, the drain voltage at which the drain current is rapidly increased, as shown in FIG. 3, can be much elevated as compared with the conventional example described in the description of the prior art section.

As described above in detail, semiconductor devices having the region of width W of the p-conductivity type have been explained.

However, this invention is not limited to the first to sixth embodiments. For example, the scope of the present invention includes a semiconductor device having a region of the width W of the N-conductivity type. In this case, the conductivity type of the channel region is the p conductivity type, the conductivity type of the region of the width W is the N conductivity type and the conductivity type of the drain region is the N conductivity type. Arsenic (As) is used for the low-concentration ion implantation and the high-concentration ion implantation. In addition, the amount of the dosage and the acceleration voltage are approximately equal to that of the ion implantation for forming the region of the width W of the P-conductivity type described above.

The region of the width W is formed in the boundary portion towards the channel region from the drain diffusion when the conductivity type of the region of the width W is N-type. The impurity concentration of the region of the width W is decreased uniformly from the drain region to the channel region.

The configuration, especially the region of width W, of the fifth embodiment is formed easier in a fabrication process than that of the fourth embodiment shown in FIG. 9, because the gate electrode is formed by self-alignment.

FIG. 15 shows another configuration of the semiconductor device of a seventh embodiment according to the present invention.

In FIG. 15, the portion of the width W of 500 Å is formed under a portion of the gate electrode between a channel region and a drain region.

The effect of the semiconductor device having the configuration shown in FIG. 15 is the same as that of the semiconductor device shown in FIG. 13(f) and FIG. 14(e).

In addition, the semiconductor devices having the configurations shown in FIG. 13(f), FIG. 14(e), and FIG. 15 according to the embodiments have the feature that the fabrication process thereof is carried out more easily than that of the semiconductor device shown in FIG. 9, because the gate electrode is formed self-aligningly.

What is claimed is:

1. A semiconductor device having a single crystal semiconductor layer formed on an insulating film, comprising:

a drain region including a high-concentration-impurity-diffusion region provided at a predetermined interval in said single crystal semiconductor layer; and a gate electrode formed on a channel region and interposed between a source region and said drain region through a gate insulating film formed between said gate electrode and said channel region and wherein, a thickness of each of said source region and said drain region is more than a thickness T of said channel region, an upper surface of said single crystal semiconductor layer facing said gate electrode is flat, said thickness T of said channel region being so adjusted as to be not more than a maximum depletion distance allowed to complete depletion of said channel region, said thickness T being obtained according to the relationship, $$T \leq 2 \; (\epsilon \phi F/(q \; N_{sub}))^{1/2}$$

where, $N_{sub}$ is an impurity concentration (per cm$^{-3}$) of the channel region in said single crystal semiconductor layer, $\epsilon$ is a dielectric constant of said single crystal semiconductor layer, $\phi F(eV)$ is a difference between a Fermi energy level and an intrinsic energy level of said channel region, and q is an electric charge of an electron (Coulombs), and wherein a region having a width W, extending from the channel region to the drain region, is set so as to be not more than the maximum depletion distance, and an impurity concentration substantially the same or larger than that of said channel region but less than that of said drain region is formed in a boundary portion between said channel region and said drain region, the width W being obtained according to the relationship, $$0 < W \leq 2[\epsilon \phi F/(q \; N_{sub})]^{1/2}$$

where, $N_{sub}$ is the impurity concentration (per cm$^{-3}$) of the channel region in said single crystal semiconductor layer, $\epsilon$ is the dielectric constant of said single crystal semiconductor layer, $\phi F(eV)$ is the difference between the Fermi energy level and the intrinsic energy level of said channel region, and q is the electric charge of an electron (Coulombs), and the thickness of the region having the width W being more than the thickness of said channel region.

2. A semiconductor device as claimed in claim 1, wherein the thickness of the region having the width W is equal to the thickness of said drain region.

3. A semiconductor device having a single crystal semiconductor layer formed on an insulating film, comprising:

a drain region including a high-concentration-impurity-diffusion region provided at a predetermined interval in said single crystal semiconductor layer; and a gate electrode formed on a channel region and interposed between a source region and said drain region through a gate insulating film formed between said gate electrode and said channel region, wherein a thickness of each of said source region and said drain region is more than a thickness T of said channel region, a bottom surface of said single crystal semiconductor layer facing said insulating film is flat, said thickness T of said channel region being set so as to be not more than a maximum depletion distance allowed to complete depletion of said channel region, said thickness T being obtained by the relationship, $$T \leq 2 \, (\epsilon \phi F/(q \, N_{sub}))^{1/2}$$

where, $N_{sub}$ is an impurity concentration (per $cm^{-3}$) of the channel region in said single crystal semiconductor layer, $\epsilon$ is a dielectric constant of said single crystal semiconductor layer, $\phi F(eV)$ is a difference between a Fermi energy level and an intrinsic energy level of said channel region, and q is an electric charge of an electron (Coulombs), a region having a width W, extending from said channel region to said drain region, being adjusted so as to be not more than the maximum depletion distance, and an impurity concentration substantially the same or larger than that of said channel region but less than that of said drain region is formed in a boundary portion between said channel region and said drain region, the width W being obtained by the relationship, $$0 < W \leq 2[\epsilon \phi F/(q \, N_{sub})]^{1/2}$$

where, $N_{sub}$ is the impurity concentration (per $cm^{-3}$) of the channel region in said single crystal semiconductor layer, $\epsilon$ is the dielectric constant of said single crystal semiconductor layer, $\phi F(eV)$ is the difference between the Fermi energy level and the intrinsic energy level of said channel region, and q is the electric charge of an electron (Coulombs), and the thickness of the region having the width W is more than the thickness of said channel region.

4. A semiconductor device as claimed in claim 3, wherein the thickness of the region having the width W is equal to the thickness of said drain region.

* * * * *